(12) United States Patent
Dainese et al.

(10) Patent No.: US 11,495,680 B2
(45) Date of Patent: Nov. 8, 2022

(54) SEMICONDUCTOR DEVICE WITH INTEGRATED CURRENT SENSOR

(71) Applicant: Infineon Technologies Austria AG, Villach (AT)

(72) Inventors: Matteo Dainese, Munich (DE); Georg Schinner, Munich (DE); Frank Wolter, Munich (DE)

(73) Assignee: Infineon Technologies Austria AG, Villach (AT)

( * ) Notice: Subject to any disclaimer, the term of this patent is extended or adjusted under 35 U.S.C. 154(b) by 163 days.

(21) Appl. No.: 17/104,483

(22) Filed: Nov. 25, 2020

(65) Prior Publication Data
US 2022/0165879 A1  May 26, 2022

(51) Int. Cl.
| | |
|---|---|
| *H01L 29/78* | (2006.01) |
| *H01L 29/40* | (2006.01) |
| *H01L 29/423* | (2006.01) |
| *H01L 29/66* | (2006.01) |
| *H01L 29/06* | (2006.01) |
| *H01L 29/739* | (2006.01) |

(52) U.S. Cl.
CPC ...... *H01L 29/7815* (2013.01); *H01L 29/0649* (2013.01); *H01L 29/0696* (2013.01); *H01L 29/401* (2013.01); *H01L 29/407* (2013.01); *H01L 29/4236* (2013.01); *H01L 29/66348* (2013.01); *H01L 29/66734* (2013.01); *H01L 29/7397* (2013.01); *H01L 29/7813* (2013.01)

(58) Field of Classification Search
CPC ............. H01L 29/7815; H01L 29/0649; H01L 29/0696; H01L 29/401; H01L 29/407; H01L 29/4236; H01L 29/66348; H01L 29/66734; H01L 29/7397; H01L 29/7813
USPC .......................................................... 257/288
See application file for complete search history.

(56) References Cited

U.S. PATENT DOCUMENTS

| | | | |
|---|---|---|---|
| 7,939,882 B2* | 5/2011 | Su ..................... | H01L 27/088 438/212 |
| 2011/0312166 A1* | 12/2011 | Yedinak .............. | H01L 29/4236 438/488 |
| 2016/0079377 A1* | 3/2016 | Hutzler ............... | H01L 29/7397 257/334 |
| 2020/0335622 A1* | 10/2020 | Hiyoshi .............. | H01L 29/7803 |

* cited by examiner

*Primary Examiner* — Igwe U Anya
(74) *Attorney, Agent, or Firm* — Murphy, Bilak & Homiller, PLLC

(57) ABSTRACT

Described herein is a power semiconductor device and corresponding method of production. The semiconductor device includes: a power device region formed in a semiconductor substrate and including first trenches and second trenches extending lengthwise in parallel with one another with semiconductor mesas between adjacent ones of the trenches, each first trench including a gate electrode at a first potential and each second trench including a field plate at a second potential; and a current sense region formed in the semiconductor substrate. A subset of the first trenches, a subset of the second trenches and a subset of the semiconductor mesas are common to both the current sense region and the power device region. The second trenches are interrupted along opposite first and second sides of the current sense region such that the field plates are interrupted between the power device region and the current sense region.

21 Claims, 9 Drawing Sheets

SEMICONDUCTOR DEVICE WITH INTEGRATED CURRENT SENSOR

BACKGROUND

Current mirrors are widely used as a current sensor for power transistors such as power MOSFETs (metal-oxide-semiconductor field-effect transistors), IGBTs (insulated gate bipolar transistors), SiC power transistors, etc. The source/emitter potential applied to the chip (die) is separated into two parts, in a part of the active device region, to allow separate contacting to a current sense pad and the main source/emitter pad. In the case of transistor cells having a stripe trench configuration, a problem arises in isolating the current mirror cells relative to the power transistor (load) cells. By using cross-trenches, the insulation between the sense and power device cells is improved without reducing thermal, current and, in the case of IGBTs, electron-hole plasma coupling.

In some approaches, the p-body doping is interrupted in a region of semiconductor mesas which separate the power device region from the current sense region, e.g., by lithography. In the case of stripe-shaped contacts, the contact stripes must also be interrupted between the power device and current sense regions. In some cases, the device may have trenches where polysilicon in the trenches is contacted to the load source/emitter potential whereas the semiconductor mesa in the current sense region is contacted to the sense source/emitter potential. Such a configuration results in undesirable capacitive coupling between the main (load) cells and the current sense cells.

The approaches described above require a relatively complicated insulation construction between the main (load) cells and current sense cells, since different accumulation and inversion layers can form at the gate depending on the working point. Furthermore, there may be a parasitic pnp structure along the semiconductor mesas which further complicates the device design.

Thus, there is a need for an improved isolation approach between the main (load) transistor cells and current sense cells integrated in the same semiconductor device.

SUMMARY

According to an embodiment of a semiconductor device, the semiconductor device comprises: a power device region formed in a semiconductor substrate and comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and a current sense region formed in the semiconductor substrate, wherein a subset of the first trenches, a subset of the second trenches and a subset of the semiconductor mesas are common to both the current sense region and the power device region, wherein the second trenches are interrupted along opposite first and second sides of the current sense region such that the field plates are interrupted between the power device region and the current sense region.

According to an embodiment of a method of producing a semiconductor device, the method comprises: forming a power device region in a semiconductor substrate, the power device region comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and forming a current sense region in the semiconductor substrate, wherein a subset of the first trenches, a subset of the second trenches and a subset of the semiconductor mesas are common to both the current sense region and the power device region, wherein forming the power device comprises forming the second trenches to be interrupted along opposite first and second sides of the current sense region such that the field plates are interrupted between the power device region and the current sense region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments for improving the isolation between the main (load) transistor cells and current sense cells integrated in the same semiconductor device. The embodiments include trench interruptions and cross-trenches, which may be used separately or in combination with one another. The trench interruption approach involves separating the trenches assigned to the main (load) emitter/source potential in the power device region of the device from the trenches assigned to the sense pad potential in the current sense region of the device. The cross-trench approach involves isolating the body regions of the main power transistor from the body regions of the current sense device using cross-trenches, in a way that simplifies the isolation chain along the mesas/trenches and minimizes parasitic couplings. Again, the trench interruption and cross-trench approaches may be used separately or in combination with one another.

In each case, the isolation techniques described herein interrupt the equipotential (gate potential and/or source/emitter potential) along the semiconductor mesas and/or along the source/emitter trenches, to better isolate the current sense device from the main power transistor. In some embodiments, two lithography process steps that are typically required for body and mesa implants can be omitted. Furthermore, a higher ESD (electrostatic discharge) strength was observed in the current sense region of the device when the source/emitter trenches in the current sense region are set at the sense pad potential. This is due to better synchronization of trench and mesa potential in the current sense region.

Described next, with reference to the figures, are exemplary embodiments of techniques for improving the isolation between the main (load) transistor cells and current sense cells integrated in the same semiconductor device.

Figure 1A:
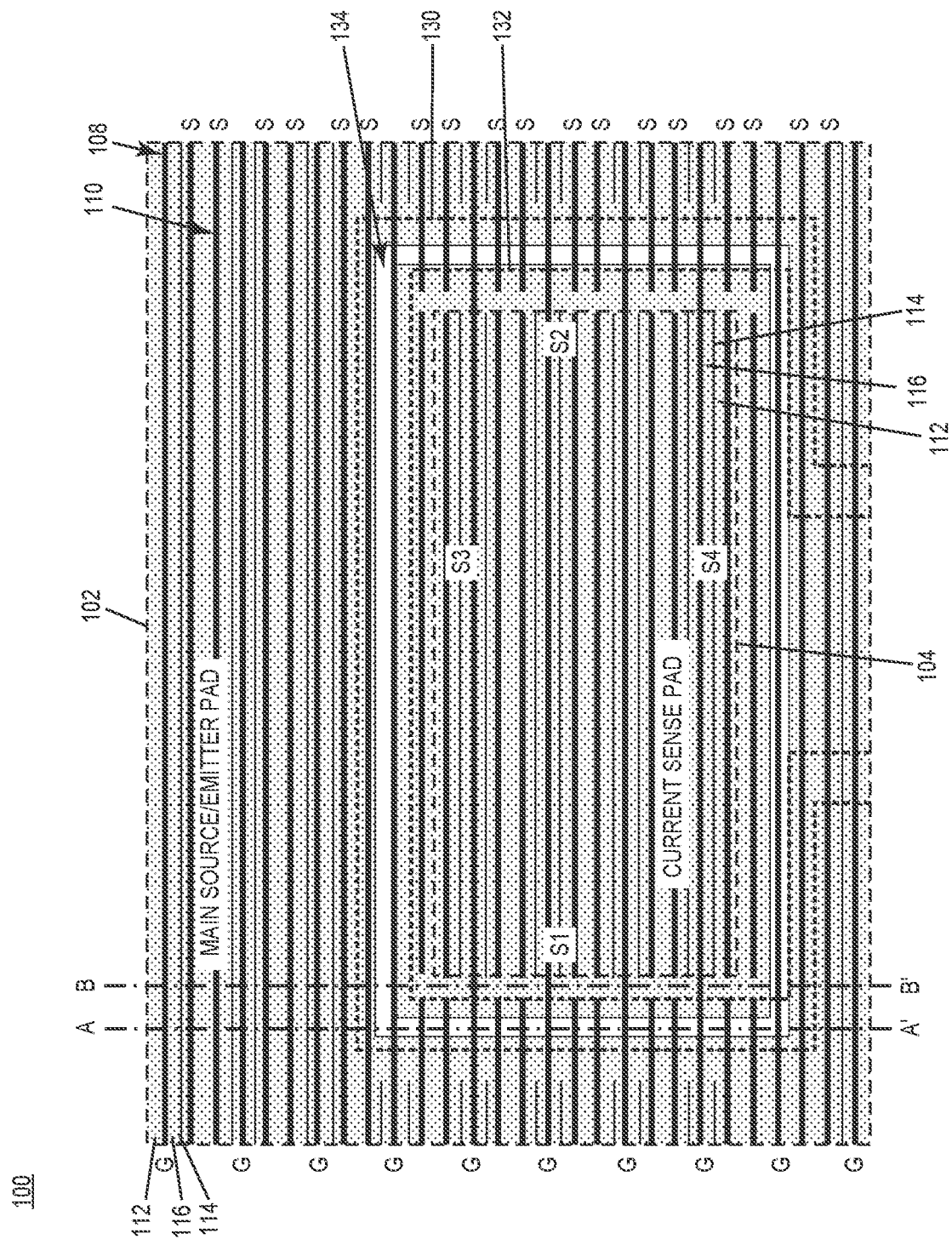
FIG. 1A illustrates a partial top plan view of an embodiment of a semiconductor device.
Figure 1B:
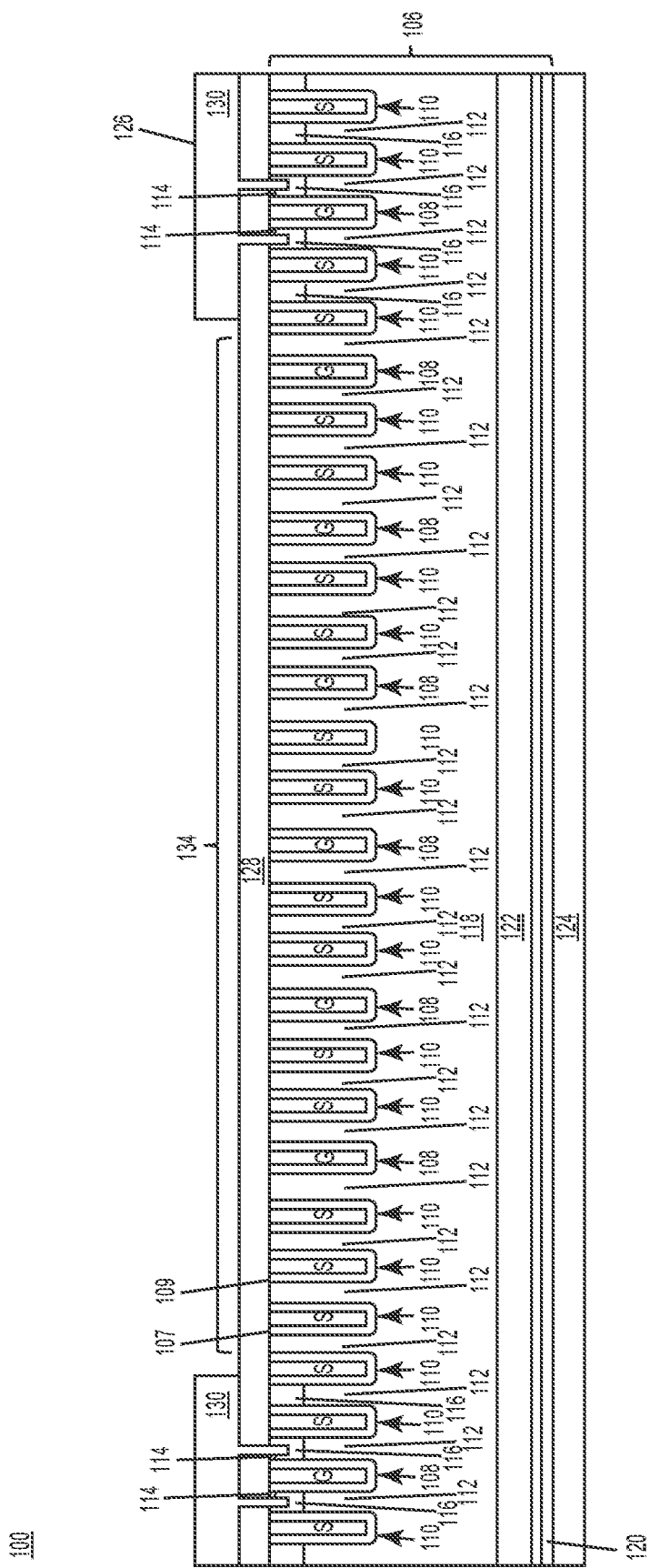
FIG. 1B illustrates a cross-sectional view of the semiconductor device along the line labelled A-A' in FIG. 1A.
Figure 1C:
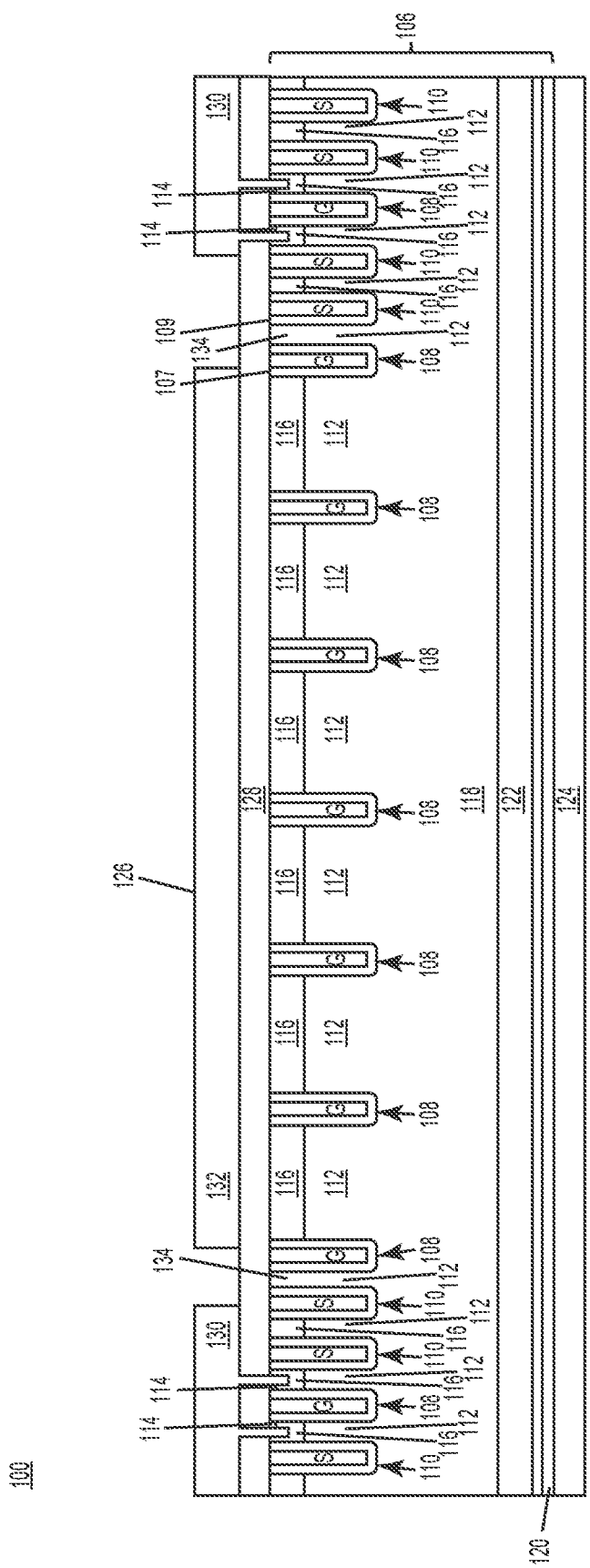
FIG. 1C illustrates a cross-sectional view of the semiconductor device along the line labelled B-B' in FIG. 1A.

FIG. 1A illustrates a partial top plan view of an embodiment of a semiconductor device 100. FIG. 1B illustrates a cross-sectional view of the semiconductor device 100 along the line labelled A-A' in FIG. 1A. FIG. 1C illustrates a cross-sectional view of the semiconductor device 100 along the line labelled B-B' in FIG. 1A.

The semiconductor device 100 includes a power device region 102 and a current sense region 104 formed in a semiconductor substrate 106. The semiconductor substrate 106 may include one or more of a variety of semiconductor materials that are used to form semiconductor devices such as power MOSFETs, IGBTs, SiC transistors, etc. For example, the semiconductor substrate 106 may include silicon (Si), silicon carbide (SiC), germanium (Ge), silicon germanium (SiGe), gallium nitride (GaN), gallium arsenide (GaAs), and the like. The semiconductor substrate 106 may be a bulk semiconductor material or may include one or more epitaxial layers grown on a bulk semiconductor material.

First trenches 108 and second trenches 110 formed in the semiconductor substrate 106 extend lengthwise in parallel with one another, with semiconductor mesas 112 confined between adjacent ones of the trenches 108, 110. Each first trench 108 includes a gate electrode 'G' at a first potential and separated from the semiconductor substrate 106 by a gate dielectric 107. Each second trench 110 includes a field plate 'S' at a second potential and separated from the semiconductor substrate 106 by a field dielectric 109. The potentials may be different or independent. For example, the first potential may be a gate potential and the second potential may be a source or emitter potential. In either case, a subset of the first trenches 108, a subset of the second trenches 110 and a subset of the semiconductor mesas 112 are common to or shared by both the current sense region 104 and the power device region 102.

Power transistor cells are formed in the power device region 102, and current sense cells are formed in the current sense region 104. For example, power MOSFET cells, IGBT cells, SiC transistor cells, etc. may be formed in the power device region 102. The current sense cells mirror the current flowing in the power device region 102.

The power device region 102 shown in FIGS. 1A through 1C is illustrated as an IGBT device having a plurality of stripe-shaped cells defined by the striped-shaped first and second trenches 108, 110 and the striped-shaped semiconductor mesas 112. The current sense region 104 may have the same cell-based configuration as the power device region 102, but with fewer cells, e.g., 1/10, 1/100, 1/1000 or even fewer cells as compared to the power device region 102.

In the case of an IGBT device, the power transistor cells in the power device region 102 and the current sense cells in the current sense region 104 further include emitter regions 114 of a first conductivity type, body regions 116 of a second conductivity type opposite the first conductivity type, a drift zone 118 of the first conductivity type, and a collector region 120 of the second conductivity type. Channels form in the body regions 116 along the gate trenches 108 to provide an electrically conductive connection between the emitter regions 114 and the drift zone 118 in both the power device region 102 and the current sense region 104. The channels are controlled by the voltage applied to the gate electrodes 'G'. The IGBT device may further include a field stop region 122 of the first conductivity type between the drift zone 118 and the collector region 120, the field stop region 122 having a higher doping concentration than the drift zone 118.

Another type of power transistor may be implemented in the power device region 102. For example, a power MOSFET or SiC transistor may be implemented in the power device region 102. In the case of a power MOSFET or SiC transistor, the collector region 120 of the second conductivity type is replaced by a drain region of the first conductivity type, the field stop region 122 is omitted, and the emitter regions 114 are instead source regions. Still other types of power transistors may be implemented in the power device region 102, e.g., such as a JFET (junction field-effect transistor) device.

As explained above, the current sense device formed in the current sense region 104 of the semiconductor substrate 106 mirrors the current flowing in the power device region 102 and typically has the same cell configuration as the main power transistor, albeit with a lower cell count. The first and second conductivity types depend on whether the semiconductor device 100 is a p-channel or n-channel device. In the case of an n-channel device, the first conductivity type is n-type and the second conductivity type is p-type. In the case of a p-channel device, the first conductivity type is p-type and the second conductivity type is n-type.

A first metallization layer 124 at the backside of the semiconductor substrate 106 provides a collector/drain potential to the cells of both the main power transistor and the current sense device. A second metallization layer 126 separated from the front side of the semiconductor substrate 106 by at least one interlayer dielectric 128 provides a gate potential to the cells of both the main power transistor and the current sense device, provides an emitter/source potential to the cells of the main power transistor, and provides a current sense connection to the cells of the current sense device formed in the current sense region 104.

The second metallization layer 126 and interlayer dielectric 128 are not shown in FIG. 1A, to provide an unobstructed view of the power device region 102 and the current sense region 104 formed in the semiconductor substrate 106. As indicated by dashed boxes in FIG. 1A, the second metallization layer 126 may include a first contact pad 'Main Source/Emitter Pad' 130 electrically connected to both the semiconductor mesas 112 and the field plates 'S' in the power device region 102 of the semiconductor substrate 106 through corresponding openings in the interlayer dielectric 128, and a second contact pad 132 'Current Sense Pad' separate from the first contact pad 130 and electrically connected to both the semiconductor mesas 112 and the field plates 'S' in the current sense region 104 of the semiconductor substrate 106 through additional openings in the interlayer dielectric 128.

As shown in FIGS. 1A and 1C, the second trenches 110 are interrupted along opposite first and second sides S1, S2 of the current sense region 104 such that the field plates 'S' are interrupted between the power device region 102 and the current sense region 104. The field plates 'S' and the emitter/source regions 114 within the power device region 102 are connected to the first contact pad 130 of the second metallization layer 126 though first openings in the interlayer dielectric 128, and the field plates 'S' and the emitter/source regions 114 within the current sense region 104 are connected to the second contact pad 132 of the second metallization layer 126 though second openings in the interlayer dielectric 128.

By ensuring that the field plates 'S' and the emitter/source regions 114 within the current sense region 104 are at the same potential as the second contact pad 132, no potential difference arises between the semiconductor mesas 112 and the field plates 'S' in the current sense region 104, avoiding capacitive coupling with the power device region 102 which can otherwise create interference/noise in dynamic performance of the current sensor. This is particularly beneficial during switching times (non-steady state) and whenever the source/emitter paths of the main power transistor and current sensor are not matched in terms of parasitics.

Switching speed/switching slopes, e.g., dV/dt in the range of 0.5 to 50 V/ns, 0.1 and 30 A/ns di/dt, etc. are important for power transistors which are typically switched in the microsecond range. For example, for a load current of 500 A and a current sense area ratio of 1 to 1000, the sense current is about 0.5 A. The load and sense currents are switched off at the same time, resulting in the main power transistor having a factor of 1000×higher switching speed. The di/dt in conjunction with stray inductance results in an overvoltage which can be high and cause mismatch between the source/emitter potential of the main power transistor and current sense device. These issues are avoided by connecting the field plates 'S' and the emitter/source regions 114 within the current sense region 104 to the same potential as the second contact pad 132 of the second metallization layer 126.

Interrupting the second trenches 110 along opposite first and second sides S1, S2 of the current sense region 104 and connecting the field plates 'S' and the emitter/source regions 114 within the current sense region 104 to the same potential as the second contact pad 132 also results in a measured improvement for ESD (electrostatic discharge) human body model performance where a higher ruggedness was observed, including at least 2 kV of insulation between the second contact pad 132 and the main transistor emitter/source potential.

The second trenches 110 may be interrupted along opposite first and second sides S1, S2 of the current sense region 104 using a photomask which prevents etching of the second trenches 110 into the semiconductor substrate 106 in targeted regions. The emitter/source regions 112 are also interrupted along the first and second sides S1, S2 of the current sense region 104 in FIGS. 1A through 1C, such that the emitter/source regions 112 are interrupted between the power device region 102 and the current sense region 104.

Also as shown in FIGS. 1A through 1C, the dopants of the second conductivity type may be omitted from the semiconductor mesas 112 or offset by the dopants of the first conductivity type in a periphery region 134 that laterally surrounds the current sense region 104. According to this embodiment, the body regions 116 are discontinuous between the power device region 102 and the current sense region 104, providing further decoupling. The emitter/source regions 114 of both the main power transistor and of the current sensor may be formed by implanting dopants of the first conductivity type into the semiconductor mesas 112 in the power device region 102 and in the current sense region 104. The body regions 116 of both the main power transistor and of the current sensor may be formed by implanting dopants of the second conductivity type into the semiconductor mesas 112 in the power device region 102 and in the current sense region 104.

The body regions 116 may be interrupted in the periphery region 134 that laterally surrounds the current sense region 104 by omitting the dopants of the second conductivity type from the semiconductor mesas 112 in the periphery region 134, e.g., using a photolithographic mask during formation of the body regions 116. In another embodiment, the body-region implant is not blocked in the periphery region 134 but instead the dopants of the second conductivity type are offset by dopants of the first conductivity type in the periphery region 134, e.g., by implanting the same or higher concentration of first-type dopants into the periphery region 134 than the second-type dopants.

Figure 2A:
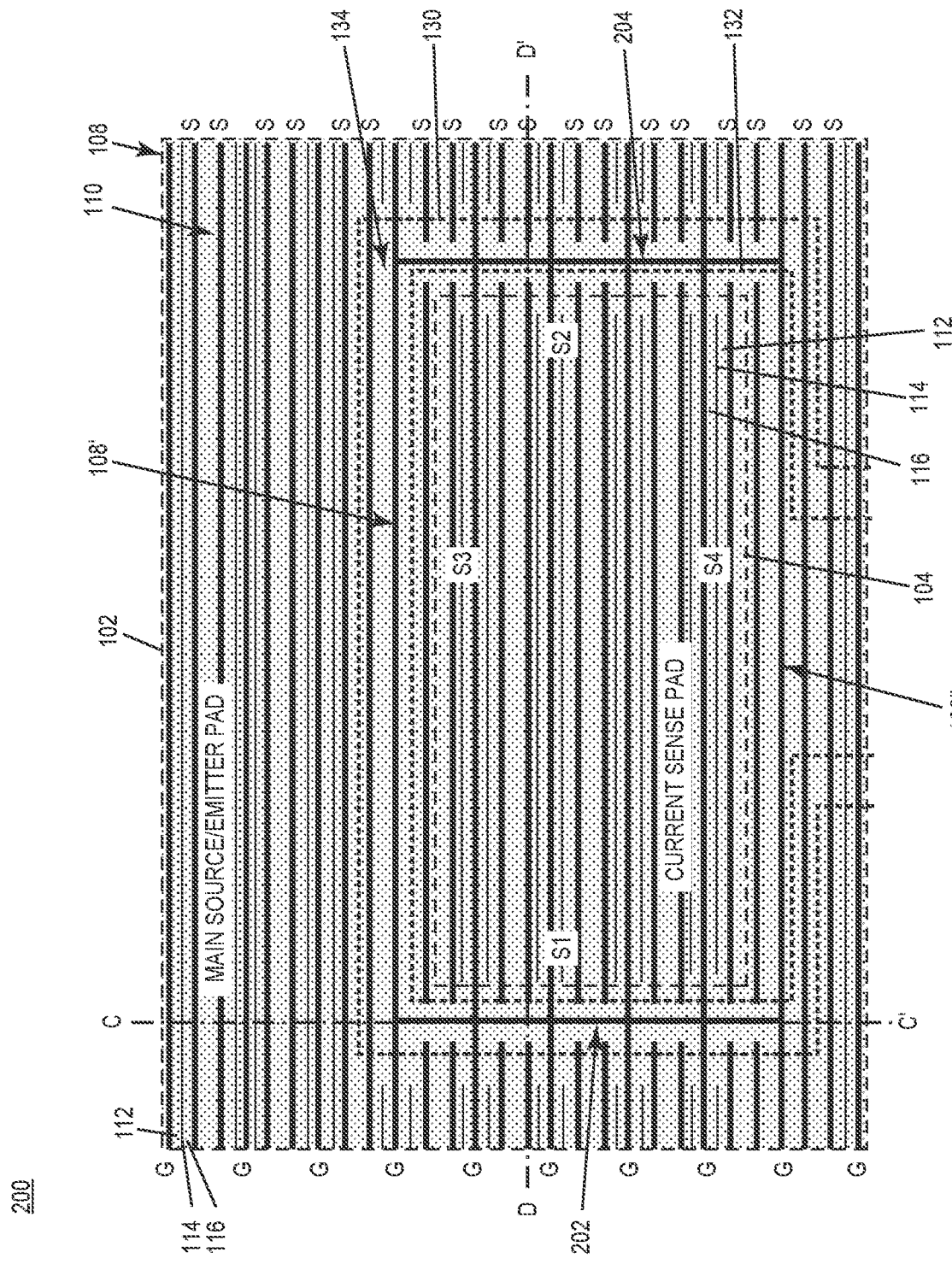
FIG. 2A illustrates a partial top plan view of another embodiment of a semiconductor device.
Figure 2B:
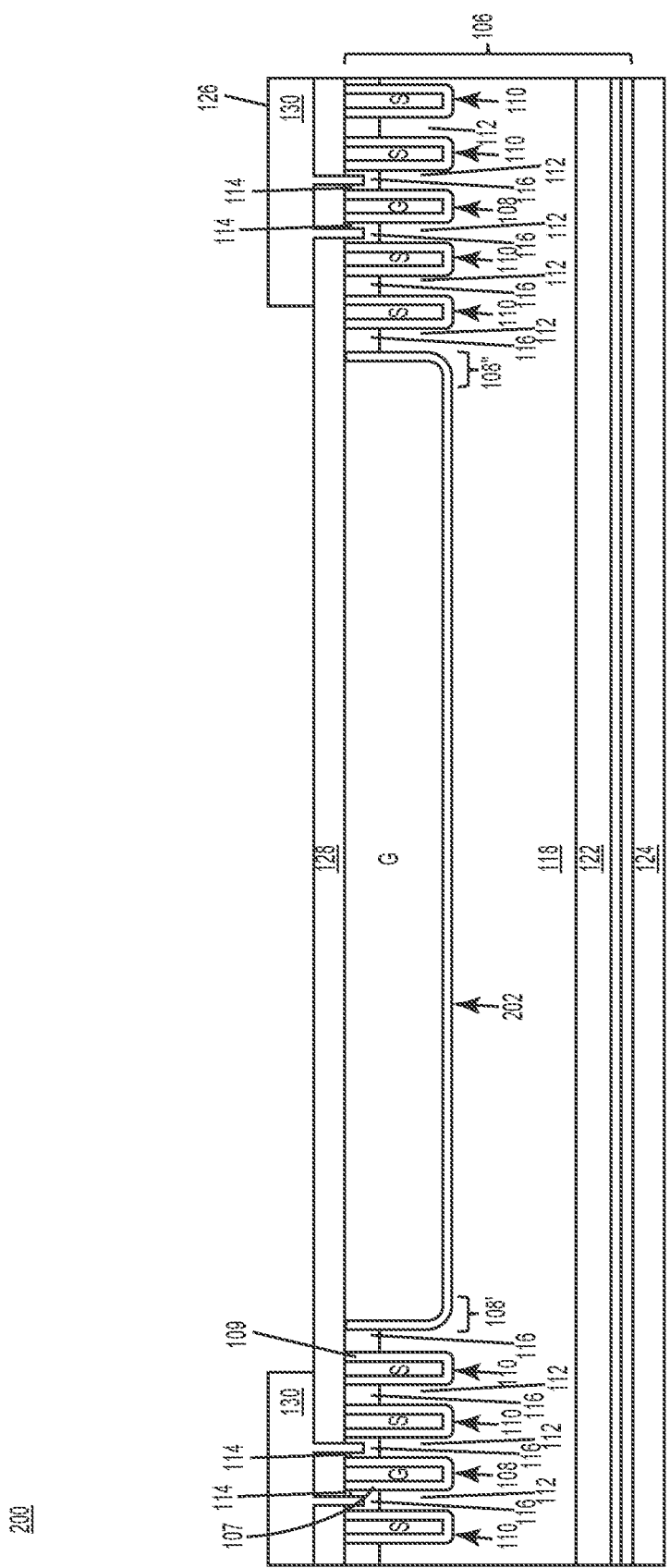
FIG. 2B illustrates a cross-sectional view of the semiconductor device along the line labelled C-C' in FIG. 2A.
Figure 2C:
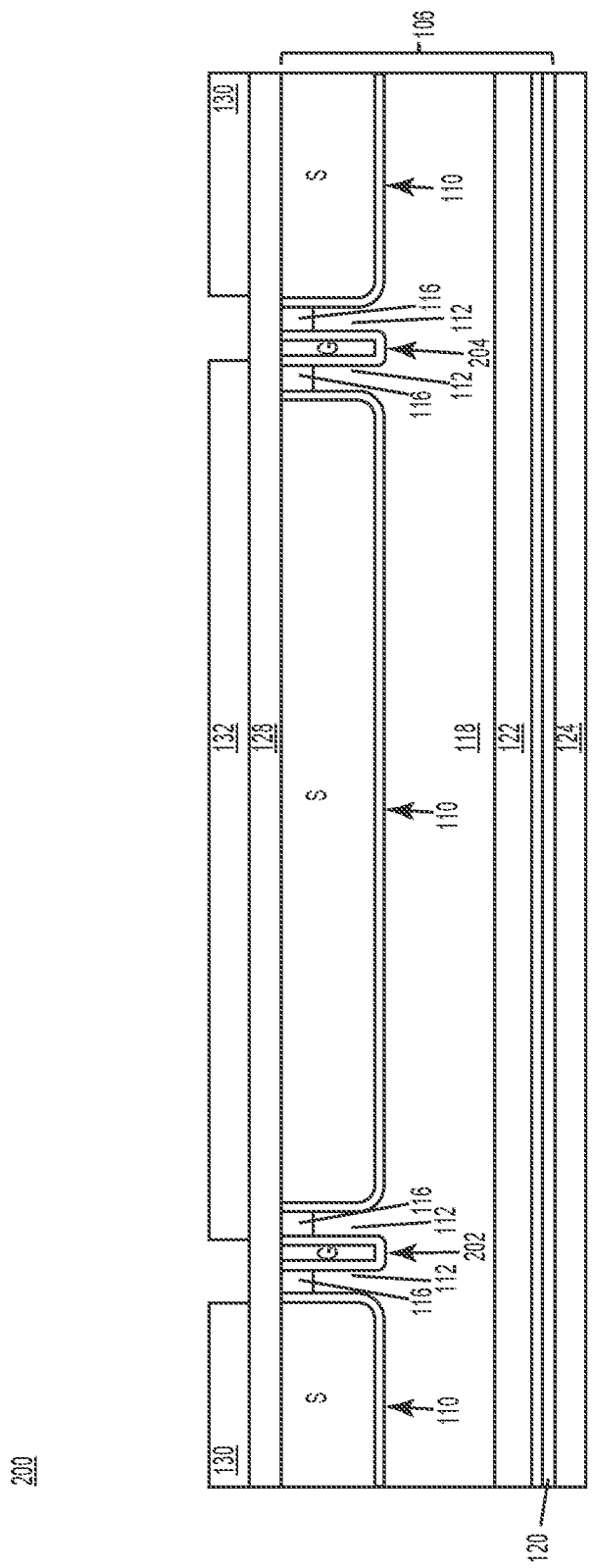
FIG. 2C illustrates a cross-sectional view of the semiconductor device along the line labelled D-D' in FIG. 2A.

FIG. 2A illustrates a partial top plan view of another embodiment of a semiconductor device 200. FIG. 2B illustrates a cross-sectional view of the semiconductor device 200 along the line labelled C-C' in FIG. 2A. FIG. 2C illustrates a cross-sectional view of the semiconductor device 200 along the line labelled D-D' in FIG. 2A.

The semiconductor device 200 shown in FIGS. 2A through 2C is similar to the semiconductor device 100 shown in FIGS. 1A through 1C. Different, however, the semiconductor device 200 shown in FIGS. 2A through 2C further includes a first intersecting trench 202 that connects the first trenches 108 in the periphery region 134 where the second trenches 110 are interrupted along the first side S1 of the current sense region 104. The semiconductor device 200 shown in FIGS. 2A through 2C also includes a second intersecting trench 204 that connects the first trenches 108 in the periphery region 134 where the second trenches 110 are interrupted along the second side S2 of the current sense region 104.

According to the embodiment illustrated in FIGS. 2A through 2C, the first intersecting trench 202, the second intersecting trench 204, the first trench 108' disposed closest to a third side S3 of the current sense region 104 and the first trench 108" disposed closest to a fourth side S4 of the current sense region 104 opposite the third side S3 are all connected to each other and laterally surround the current sense region 104 such that the body regions 116 in the current sense region 104 are decoupled from the body regions 116 in the power device region 102 by the trenches 202, 204, 108', 108" that laterally surround the current sense region 104. The body region and hence source/emitter isolation provided between the power device region 102 and the current sense region 102 is provided by the dielectric insulation 107, 109 of the trenches 202, 204, 108', 108" and which can withstand a large range of operational conditions.

Additional steps need not necessarily be taken to omit or offset the dopants of the second conductivity type in the periphery region 134 that laterally surrounds the current sense region 104 to provide the body region decoupling between the power device region 102 and the current sense region 104, saving two lithography process steps. That is, the body regions 116 of the power device region 102 may extend into the periphery region 134 that laterally surrounds the current sense region 104 but are still separated from the body regions 116 in the current sense region 104 by the trench structure 202, 204, 108', 108" that laterally surrounds the current sense region 104, since the trench structure 202, 204, 108', 108" can extend deeper into the semiconductor substrate 106 than the body regions 116 as shown in FIGS. 2B and 2C.

Figure 3:
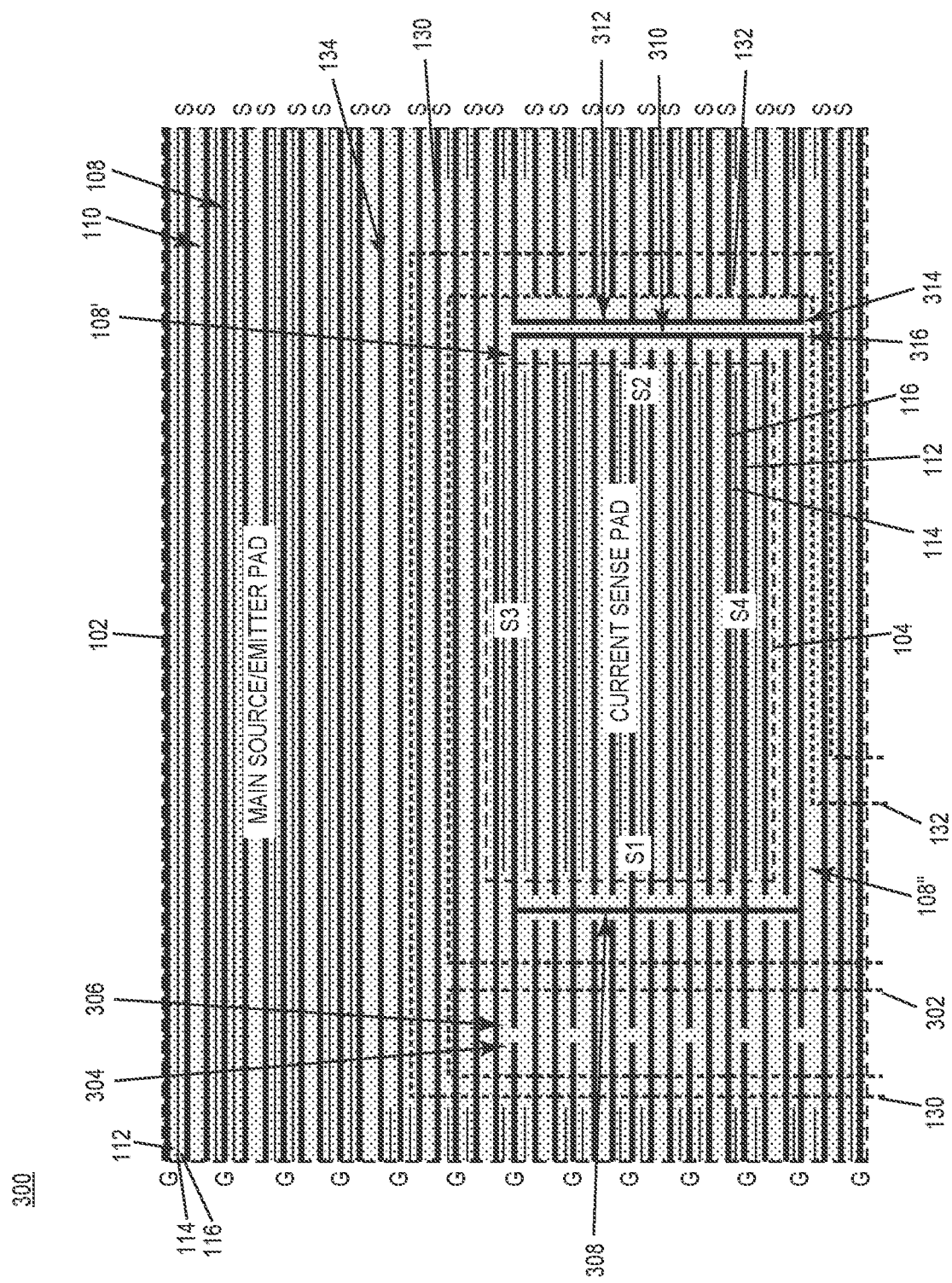
FIG. 3 illustrates a partial top plan view of another embodiment of a semiconductor device.

FIG. 3 illustrates a partial top plan view of another embodiment of a semiconductor device 300. The semiconductor device 300 shown in FIG. 3 is similar to the semiconductor device 200 shown in FIGS. 2A through 2C. Different, however, an additional level of isolation is provided by interrupting the first trenches 108 along the opposite first and second sides S1, S2 of the current sense region 104. The first trenches 108 are interrupted at first and second interruption regions and the second trenches 110 are interrupted at third and fourth interruption regions, the first and second interruption regions being laterally offset from the third and fourth interruption regions along a length direction of the trenches 108, 110. The first trenches 108 may be interrupted using lithography, by preventing etching of the first trenches 108 into the semiconductor substrate 106 in targeted regions.

According to the embodiment illustrated in FIG. 3, the metallization layer 126 above the semiconductor substrate 106 also includes a first gate runner 302 disposed over the first region where the first trenches 108 are interrupted. Only an outline of the gate runner 302 is shown in FIG. 3 to provide an unobstructed view of the power device region 102 and the current sense region 104 formed in the semiconductor substrate 106.

The first trenches 108 are interrupted under the first gate runner 302. Gate potential is provided by the first gate runner 302 to both segments of the first trenches 108 in this region, but the first trenches 108 are otherwise interrupted in the semiconductor substrate 106 in this region. The gate electrodes 'G' in the first trenches 108 that are interrupted in the first region are electrically connected to the first gate runner 302 at both ends 304, 306 of the interruption, through corresponding openings in the interlayer dielectric 128 that separates the metallization layer 126 from the semiconductor substrate 106. In one embodiment, the first gate runner 302 is interposed between the first contact pad 130 and the second contact pad 132 of the metallization layer 126. Only an outline of the first contact pad 130 and the second contact pad 132 are shown in FIG. 3 to provide an unobstructed view of the power device region 102 and the current sense region 104 formed in the semiconductor substrate 106.

The metallization layer 126 may further include at least one additional gate runner separate from the first gate runner 302. The gate electrodes 'G' in the power device region 102 are electrically connected to both the first gate runner 302 and the at least one additional gate runner, to provide redundant electrical connectivity for the gate electrodes 'G' in the power device region 102. FIG. 3 is a partial top plan view and as such, the at least one additional gate runner is out of view but may be positioned over another part of the semiconductor substrate 106 to provide another gate connection point for the gate electrodes 'G' in the power device region 102.

The semiconductor device 300 may include a first intersecting trench 308 that connects the first trenches 108 in a region where the second trenches 110 are interrupted along the first side S1 of the current sense region 104, a second intersecting trench 310 that connects the first trenches 108 in a region where the second trenches 110 are interrupted along the second (opposite) side S2 of the current sense region 104. The first intersecting trench 308, the second intersecting trench 310, the first trench 108' disposed closest to a third side S3 of the current sense region 104 and the first trench 108" disposed closest to a fourth side S4 of the current sense region 104 opposite the third side S3 laterally surround the current sense region 104 such that the body regions 116 in the current sense region 104 are decoupled from the body regions 116 in the power device region 102 by the trenches 308, 310, 108', 108" that laterally surround the current sense region 104.

According to an embodiment, a third intersecting trench 312 runs parallel with and adjacent to the second intersecting trench 310. The third interconnecting trench 312 connects the gate electrodes 'G' in the first trenches 108 in the region where the second trenches 110 are interrupted along the second side S2 of the current sense region 104 at a first end 314 of the interruption. The second interconnecting trench 310 connects the gate electrodes 'G' in the first trenches 108 in the region where the second trenches 110 are interrupted along the second side S2 of the current sense region 104 at a second end 316 of the interruption opposite the first end 310.

Separating the first trenches 108 between the power device region 102 and the current sense region 104 along the second side S2 of the current sense region 104 and by crossing the gate electrodes "G" provides gate contact redundancy in that the gate electrodes 'G' in the first trenches 108 are contacted in multiple locations, e.g., along the first side 51 of the current sense region 104 and the second side S2 of the current sense region 104 via the first gate runner 302.

Figure 4:
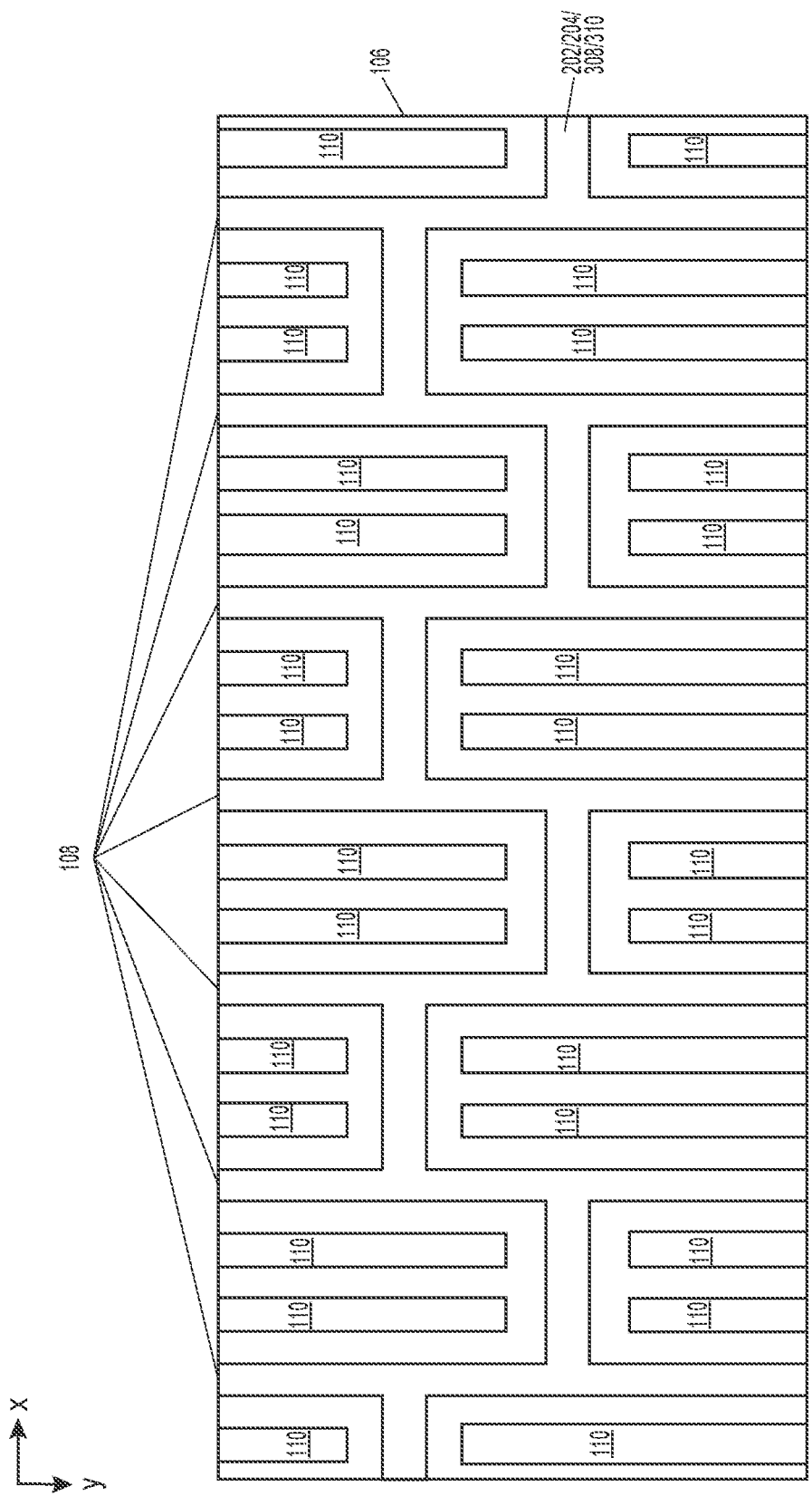
FIG. 4 illustrates a simplified top plan view of an embodiment of gate trenches and emitter/source trenches in a border region between a power device region and a current sense region of a semiconductor device.

FIG. 4 illustrates a simplified top plan view of another embodiment of the first trenches 108 and the second trenches in the border region between the power device region 102 and the current sense region 104, with the trench electrodes and doped device regions omitted for ease of illustration. According to this embodiment, the second trenches 110 are interrupted in a staggered manner in a direction (x direction in FIG. 4) perpendicular to the lengthwise extension (y direction in FIG. 4) of the trenches 108, 110. The first trenches are connected between the staggered interruptions of the second trenches 110 in a ladder-like manner along the width-wise extension (x direction in FIG. 4) of the trenches 108, 110.

Figure 5:
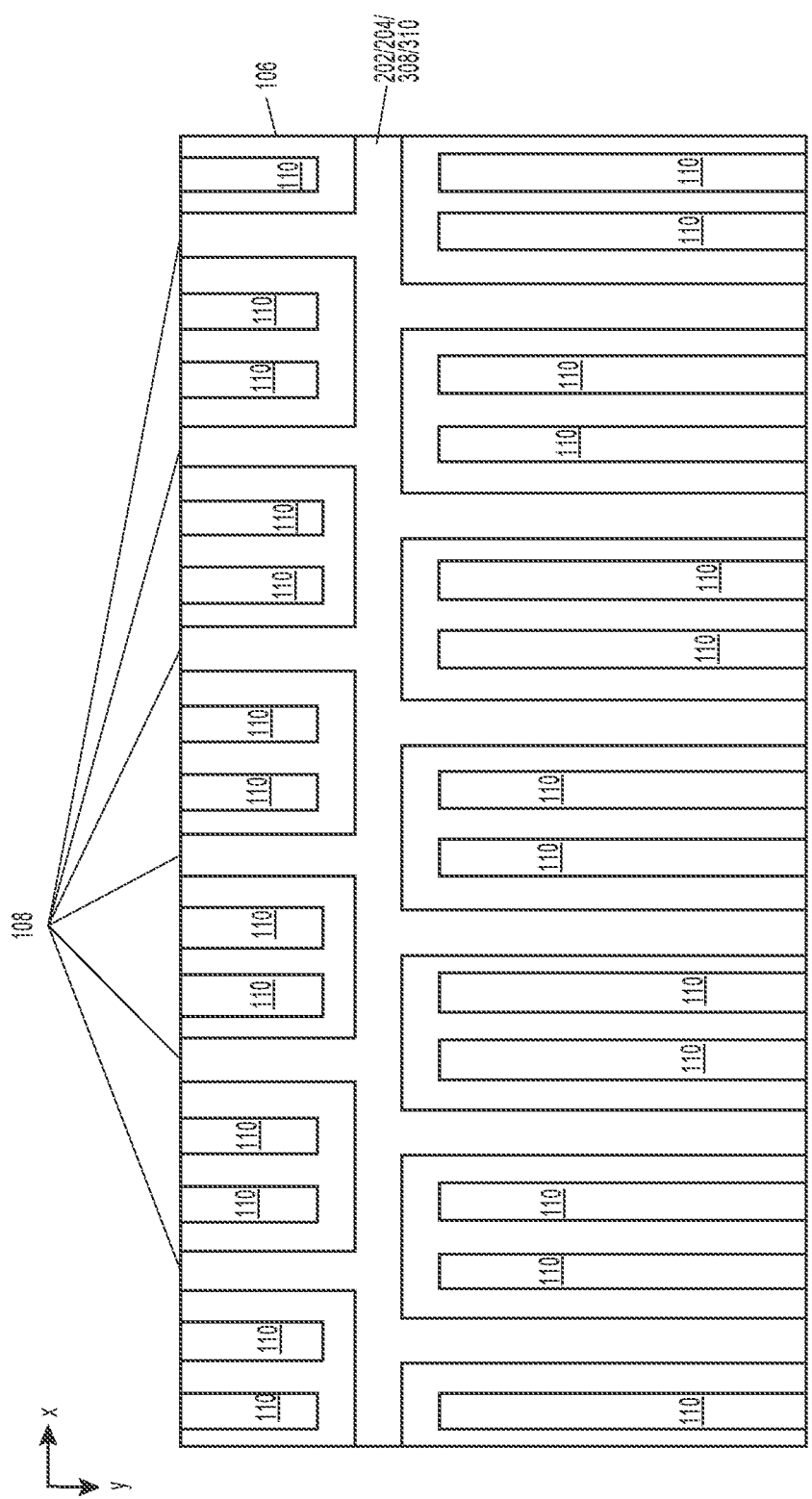
FIG. 5 illustrates a simplified top plan view of another embodiment of gate trenches and emitter/source trenches in a border region between a power device region and a current sense region of a semiconductor device.

FIG. 5 illustrates a simplified top plan view of another embodiment of the first trenches 108 and the second trenches in the border region between the power device region 102 and the current sense region 104, with the trench electrodes and doped device regions omitted for ease of illustration. According to this embodiment, the first and second trenches 108, 110 in the current sense region 104 are offset or shifted by one trench position with respect to the first and second trenches 108, 110 in the power device region 102 in a lengthwise direction (y direction in FIG. 5) of the trenches 108, 100.

Although the present disclosure is not so limited, the following numbered examples demonstrate one or more aspects of the disclosure.

EXAMPLE 1

A semiconductor device, comprising: a power device region formed in a semiconductor substrate and comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and a current sense region formed in the semiconductor substrate, wherein a subset of the first trenches, a subset of the second trenches and a subset of the semiconductor mesas are common to both the current sense region and the power device region, wherein the second trenches are interrupted along opposite first and second sides of the current sense region such that the field plates are interrupted between the power device region and the current sense region.

EXAMPLE 2

The semiconductor device of example 1, further comprising: a metallization layer above the semiconductor substrate, the metallization layer comprising a first contact pad electrically connected to both the semiconductor mesas and the field plates in the power device region, and a second contact pad separate from the first contact pad and electrically connected to both the semiconductor mesas and the field plates in the current sense region.

EXAMPLE 3

The semiconductor device of example 1 or 2, wherein the semiconductor mesas comprise source or emitter regions formed by dopants of a first conductivity type and body regions formed by dopants of a second conductivity type opposite the first conductivity type, and wherein the dopants of the second conductivity type are omitted from the semiconductor mesas or offset by the dopants of the first conductivity type in a periphery region that laterally surrounds the current sense region.

EXAMPLE 4

The semiconductor device of any of examples 1 through 3, further comprising: a first intersecting trench that connects the first trenches in a region where the second trenches are interrupted along the first side of the current sense region; and a second intersecting trench that connects the first trenches in a region where the second trenches are interrupted along the second side of the current sense region, wherein the semiconductor mesas comprise source or emitter regions of a first conductivity type and body regions of a second conductivity type opposite the first conductivity type, and wherein the first intersecting trench, the second intersecting trench, the first trench disposed closest to a third side of the current sense region and the first trench disposed closest to a fourth side of the current sense region opposite the third side laterally surround the current sense region such that the body regions in the current sense region are decoupled from the body regions in the power device region by the trenches that laterally surround the current sense region.

EXAMPLE 5

The semiconductor device of any of examples 1 through 4, wherein the first trenches are interrupted along the first and second sides of the current sense region.

EXAMPLE 6

The semiconductor device of example 5, wherein the first trenches are interrupted at first and second interruption regions and the second trenches are interrupted at third and fourth interruption regions, and wherein the first and second interruption regions are laterally offset from the third and fourth interruption regions along a length direction of the trenches.

EXAMPLE 7

The semiconductor device of example 5 or 6, further comprising: a metallization layer above the semiconductor substrate, wherein the metallization layer comprises: a first contact pad electrically connected to both the semiconductor mesas and the field plates in the power device region; a second contact pad separate from the first contact pad and electrically connected to both the semiconductor mesas and the field plates in the current sense region; and a first gate runner disposed over a first region where the first trenches are interrupted, wherein the gate electrodes in the first trenches that are interrupted in the first region are electrically connected to the first gate runner at both ends of the interruption.

EXAMPLE 8

The semiconductor device of example 7, wherein the first gate runner is interposed between the first contact pad and the second contact pad.

EXAMPLE 9

The semiconductor device of example 7 or 8, wherein the metallization layer further comprises: at least one additional gate runner separate from the first gate runner, wherein the gate electrodes in the first trenches are electrically connected to the at least one additional gate runner.

EXAMPLE 10

The semiconductor device of any of examples 5 through 9, further comprising: a first intersecting trench that connects the first trenches in a region where the second trenches are interrupted along the first side of the current sense region; and a second intersecting trench that connects the first trenches in a region where the second trenches are interrupted along the second side of the current sense region, wherein the semiconductor mesas comprise source or emitter regions of a first conductivity type and body regions of a second conductivity type opposite the first conductivity type, and wherein the first intersecting trench, the second intersecting trench, the first trench disposed closest to a third side of the current sense region and the first trench disposed closest to a fourth side of the current sense region opposite the third side laterally surround the current sense region such that the body regions in the current sense region are decoupled from the body regions in the power device region by the trenches that laterally surround the current sense region.

EXAMPLE 11

The semiconductor device of example 10, further comprising: a third intersecting trench that runs parallel with and adjacent to the second intersecting trench, wherein the third interconnecting trench connects the gate electrodes in the first trenches in the region where the second trenches are interrupted along the second side of the current sense region at a first end of the interruption, and wherein the second interconnecting trench connects the gate electrodes in the first trenches in the region where the second trenches are interrupted along the second side of the current sense region at a second end of the interruption opposite the first end.

EXAMPLE 12

A method of producing a semiconductor device, the method comprising: forming a power device region in a semiconductor substrate, the power device region comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and forming a current sense region in the semiconductor substrate, wherein a subset of the first trenches, a subset of the second trenches and a subset of the semiconductor mesas are common to both the current sense region and the power device region, wherein forming the power device comprises forming the second trenches to be interrupted along opposite first and second sides of the current sense region such that the field plates are interrupted between the power device region and the current sense region.

EXAMPLE 13

The method of example 12, further comprising: forming a metallization layer above the semiconductor substrate, the metallization layer comprising a first contact pad electrically connected to both the semiconductor mesas and the field plates in the power device region, and a second contact pad separate from the first contact pad and electrically connected to both the semiconductor mesas and the field plates in the current sense region.

EXAMPLE 14

The method of example 12 or 13, further comprising: implanting dopants of a first conductivity type into the semiconductor mesas to form source or emitter regions; implanting dopants of a second conductivity type opposite the first conductivity type into the semiconductor mesas to form body regions; and omitting the dopants of the second conductivity type from the semiconductor mesas or offsetting the dopants of the second conductivity type by the dopants of the first conductivity type in a periphery region that laterally surrounds the current sense region.

EXAMPLE 15

The method of any of examples 12 through 14, further comprising: forming a first intersecting trench that connects the first trenches in a region where the second trenches are interrupted along the first side of the current sense region; and forming a second intersecting trench that connects the first trenches in a region where the second trenches are interrupted along the second side of the current sense region, wherein the first intersecting trench, the second intersecting trench, the first trench disposed closest to a third side of the current sense region and the first trench disposed closest to a fourth side of the current sense region opposite the third side laterally surround the current sense region such that body regions in the current sense region are decoupled from body regions in the power device region by the trenches that laterally surround the current sense region.

EXAMPLE 16

The method of any of examples 12 through 15, further comprising: forming the first trenches to be interrupted along the first and second sides of the current sense region.

EXAMPLE 17

The method of example 16, further comprising: forming a metallization layer above the semiconductor substrate, the metallization layer comprising: a first contact pad electrically connected to both the semiconductor mesas and the field plates in the power device region; a second contact pad separate from the first contact pad and electrically connected to both the semiconductor mesas and the field plates in the current sense region; and a first gate runner disposed over a first region where the first trenches are interrupted; and electrically connecting the gate electrodes in the first trenches that are interrupted in the first region to the first gate runner at both ends of the interruption.

EXAMPLE 18

The method of example 17, wherein the first gate runner is interposed between the first contact pad and the second contact pad.

EXAMPLE 19

The method of example 17 or 18, wherein the metallization layer further comprises at least one additional gate runner separate from the first gate runner, the method further comprising: electrically connecting the gate electrodes in the first trenches to the at least one additional gate runner.

EXAMPLE 20

The method of any of examples 16 through 19, further comprising: forming a first intersecting trench that connects the first trenches in a region where the second trenches are interrupted along the first side of the current sense region; and forming a second intersecting trench that connects the first trenches in a region where the second trenches are interrupted along the second side of the current sense region, wherein the first intersecting trench, the second intersecting trench, the first trench disposed closest to a third side of the current sense region and the first trench disposed closest to a fourth side of the current sense region opposite the third side laterally surround the current sense region such that body regions in the current sense region are decoupled from body regions in the power device region by the trenches that laterally surround the current sense region.

EXAMPLE 21

The method of example 20, further comprising: forming a third intersecting trench that runs parallel with and adjacent to the second intersecting trench; connecting, via the third interconnecting trench, the gate electrodes in the first trenches in the region where the second trenches are interrupted along the second side of the current sense region at a first end of the interruption; and connecting, via the second interconnecting trench, the gate electrodes in the first trenches in the region where the second trenches are interrupted along the second side of the current sense region at a second end of the interruption opposite the first end.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a power device region formed in a semiconductor substrate and comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and
a current sense region formed in the semiconductor substrate,
wherein a subset of the first trenches, a subset of the second trenches and a subset of the semiconductor mesas are common to both the current sense region and the power device region,
wherein the second trenches are interrupted along opposite first and second sides of the current sense region such that the field plates are interrupted between the power device region and the current sense region.

2. The semiconductor device of claim 1, further comprising:
a metallization layer above the semiconductor substrate, the metallization layer comprising a first contact pad electrically connected to both the semiconductor mesas and the field plates in the power device region, and a second contact pad separate from the first contact pad and electrically connected to both the semiconductor mesas and the field plates in the current sense region.

3. The semiconductor device of claim 1, wherein the semiconductor mesas comprise source or emitter regions formed by dopants of a first conductivity type and body regions formed by dopants of a second conductivity type opposite the first conductivity type, and wherein the dopants of the second conductivity type are omitted from the semiconductor mesas or offset by the dopants of the first conductivity type in a periphery region that laterally surrounds the current sense region.

4. The semiconductor device of claim 1, further comprising:
a first intersecting trench that connects the first trenches in a region where the second trenches are interrupted along the first side of the current sense region; and
a second intersecting trench that connects the first trenches in a region where the second trenches are interrupted along the second side of the current sense region,
wherein the semiconductor mesas comprise source or emitter regions of a first conductivity type and body regions of a second conductivity type opposite the first conductivity type, and
wherein the first intersecting trench, the second intersecting trench, the first trench disposed closest to a third side of the current sense region and the first trench disposed closest to a fourth side of the current sense region opposite the third side laterally surround the current sense region such that the body regions in the current sense region are decoupled from the body regions in the power device region by the trenches that laterally surround the current sense region.

5. The semiconductor device of claim 1, wherein the first trenches are interrupted along the first and second sides of the current sense region.

6. The semiconductor device of claim 5, wherein the first trenches are interrupted at first and second interruption regions and the second trenches are interrupted at third and fourth interruption regions, and wherein the first and second interruption regions are laterally offset from the third and fourth interruption regions along a length direction of the trenches.

7. The semiconductor device of claim 5, further comprising:
a metallization layer above the semiconductor substrate, wherein the metallization layer comprises:
a first contact pad electrically connected to both the semiconductor mesas and the field plates in the power device region;
a second contact pad separate from the first contact pad and electrically connected to both the semiconductor mesas and the field plates in the current sense region; and
a first gate runner disposed over a first region where the first trenches are interrupted,
wherein the gate electrodes in the first trenches that are interrupted in the first region are electrically connected to the first gate runner at both ends of the interruption.

8. The semiconductor device of claim 7, wherein the first gate runner is interposed between the first contact pad and the second contact pad.

9. The semiconductor device of claim 7, wherein the metallization layer further comprises:
at least one additional gate runner separate from the first gate runner,
wherein the gate electrodes in the first trenches are electrically connected to the at least one additional gate runner.

10. The semiconductor device of claim 5, further comprising:
a first intersecting trench that connects the first trenches in a region where the second trenches are interrupted along the first side of the current sense region; and
a second intersecting trench that connects the first trenches in a region where the second trenches are interrupted along the second side of the current sense region,
wherein the semiconductor mesas comprise source or emitter regions of a first conductivity type and body regions of a second conductivity type opposite the first conductivity type, and
wherein the first intersecting trench, the second intersecting trench, the first trench disposed closest to a third side of the current sense region and the first trench disposed closest to a fourth side of the current sense region opposite the third side laterally surround the current sense region such that the body regions in the current sense region are decoupled from the body regions in the power device region by the trenches that laterally surround the current sense region.

11. The semiconductor device of claim 10, further comprising:
a third intersecting trench that runs parallel with and adjacent to the second intersecting trench,
wherein the third interconnecting trench connects the gate electrodes in the first trenches in the region where the second trenches are interrupted along the second side of the current sense region at a first end of the interruption, and wherein the second interconnecting trench connects the gate electrodes in the first trenches in the region where the second trenches are interrupted along the second side of the current sense region at a second end of the interruption opposite the first end.

12. A method of producing a semiconductor device, the method comprising:

forming a power device region in a semiconductor substrate, the power device region comprising a plurality of first trenches and a plurality of second trenches extending lengthwise in parallel with one another with semiconductor mesas between adjacent ones of the trenches, each first trench comprising a gate electrode at a first potential and each second trench comprising a field plate at a second potential; and forming a current sense region in the semiconductor substrate, wherein a subset of the first trenches, a subset of the second trenches and a subset of the semiconductor mesas are common to both the current sense region and the power device region, wherein forming the power device comprises forming the second trenches to be interrupted along opposite first and second sides of the current sense region such that the field plates are interrupted between the power device region and the current sense region.

13. The method of claim 12, further comprising:

forming a metallization layer above the semiconductor substrate, the metallization layer comprising a first contact pad electrically connected to both the semiconductor mesas and the field plates in the power device region, and a second contact pad separate from the first contact pad and electrically connected to both the semiconductor mesas and the field plates in the current sense region.

14. The method of claim 12, further comprising:

implanting dopants of a first conductivity type into the semiconductor mesas to form source or emitter regions;

implanting dopants of a second conductivity type opposite the first conductivity type into the semiconductor mesas to form body regions; and omitting the dopants of the second conductivity type from the semiconductor mesas or offsetting the dopants of the second conductivity type by the dopants of the first conductivity type in a periphery region that laterally surrounds the current sense region.

15. The method of claim 12, further comprising:

forming a first intersecting trench that connects the first trenches in a region where the second trenches are interrupted along the first side of the current sense region; and forming a second intersecting trench that connects the first trenches in a region where the second trenches are interrupted along the second side of the current sense region;

wherein the first intersecting trench, the second intersecting trench, the first trench disposed closest to a third side of the current sense region and the first trench disposed closest to a fourth side of the current sense region opposite the third side laterally surround the current sense region such that body regions in the current sense region are decoupled from body regions in the power device region by the trenches that laterally surround the current sense region.

16. The method of claim 12, further comprising:

forming the first trenches to be interrupted along the first and second sides of the current sense region.

17. The method of claim 16, further comprising:

forming a metallization layer above the semiconductor substrate, the metallization layer comprising: a first contact pad electrically connected to both the semiconductor mesas and the field plates in the power device region; a second contact pad separate from the first contact pad and electrically connected to both the semiconductor mesas and the field plates in the current sense region; and a first gate runner disposed over a first region where the first trenches are interrupted; and electrically connecting the gate electrodes in the first trenches that are interrupted in the first region to the first gate runner at both ends of the interruption.

18. The method of claim 17, wherein the first gate runner is interposed between the first contact pad and the second contact pad.

19. The method of claim 17, wherein the metallization layer further comprises at least one additional gate runner separate from the first gate runner, the method further comprising:

electrically connecting the gate electrodes in the first trenches to the at least one additional gate runner.

20. The method of claim 16, further comprising:

forming a first intersecting trench that connects the first trenches in a region where the second trenches are interrupted along the first side of the current sense region; and forming a second intersecting trench that connects the first trenches in a region where the second trenches are interrupted along the second side of the current sense region;

wherein the first intersecting trench, the second intersecting trench, the first trench disposed closest to a third side of the current sense region and the first trench disposed closest to a fourth side of the current sense region opposite the third side laterally surround the current sense region such that body regions in the current sense region are decoupled from body regions in the power device region by the trenches that laterally surround the current sense region.

21. The method of claim 20, further comprising:

forming a third intersecting trench that runs parallel with and adjacent to the second intersecting trench;

connecting, via the third interconnecting trench, the gate electrodes in the first trenches in the region where the second trenches are interrupted along the second side of the current sense region at a first end of the interruption; and connecting, via the second interconnecting trench, the gate electrodes in the first trenches in the region where the second trenches are interrupted along the second side of the current sense region at a second end of the interruption opposite the first end.

* * * * *